United States Patent [19]
Jewell

[11] Patent Number: 5,985,683
[45] Date of Patent: Nov. 16, 1999

[54] METHOD FOR PRODUCING AN APERTURE COMPRISING AN OXIDIZED REGION AND A SEMICONDUCTOR MATERIAL

[75] Inventor: Jack L. Jewell, Boulder, Colo.

[73] Assignee: Picolight, Inc., Boulder, Colo.

[21] Appl. No.: 08/964,861

[22] Filed: Nov. 5, 1997

Related U.S. Application Data

[62] Division of application No. 08/699,697, Aug. 19, 1996, Pat. No. 5,724,374.

[51] Int. Cl.$^6$ .................................................. H01L 21/20
[52] U.S. Cl. ................................ 438/22; 438/41; 438/44
[58] Field of Search ................................ 438/22, 38, 39, 438/40, 41, 42, 43, 44, 46, 47, 767, 400

[56] References Cited

U.S. PATENT DOCUMENTS

| | | | |
|---|---|---|---|
| 4,151,546 | 4/1979 | Kawagai et al. | 257/775 |
| 4,255,207 | 3/1981 | Nicolay et al. | 438/427 |
| 4,458,407 | 7/1984 | Hoeg, Jr. et al. | 438/261 |
| 4,810,668 | 3/1989 | Ito | 438/432 |
| 5,073,516 | 12/1991 | Moslehi | 438/429 |
| 5,262,360 | 11/1993 | Holonyak | 438/767 |
| 5,373,522 | 12/1994 | Holonyak, Jr. et al. | 372/45 |
| 5,385,861 | 1/1995 | Bashir et al. | 438/427 |
| 5,400,354 | 3/1995 | Ludowise et al. | 438/767 |
| 5,411,913 | 5/1995 | Bashir et al. | 438/427 |
| 5,493,577 | 2/1996 | Choquette et al. | 372/46 |

OTHER PUBLICATIONS

Burton et al "Wet Thermal Oxidation of AlGaAs Compounds" vol. 76, pp. 5503–5507, Nov. 1994.

Nickel, "A Detailed Experimental Study of the Wet Oxidation Kinetics of AlGaAs Layers" vol. 78 pp. 5501–5503, Oct. 1995.

Floyd "Comparison of Optical Losses in Dielectric–Apertured Vertical–Cavity Lasers", IEEE Photonics Technology Letters, vol. 8, No. 5, May 1996.

Choquette, et al., "Low threshold Voltage Vertical–Cavity Lasers Fabricated by Selective Oxidation," Electronics Letters, vol. 24, pp. 2043–2044, 1994.

Choquette, et al., "Fabrication and Performance of Selectively Oxidized Vertical–Cavity Lasers," IEEE Photonics Technology Letters, vol. 7, pp. 1237–1239, (Nov., 1995).

Dallesasse, et al., "Hydrolyzation Oxidation of $Al_xGa_{1-x}As$–AlAs–GaAs Quantum Well Heterostructures and Superlattices," Applied Physics Letters, vol. 57, pp. 2844–2846, 1990.

Babic, et al., "Room–Temperature Continuous–Wave Operation of 1.54μm Vertical–Cavity Lasers," IEEE Photonics Technology Letters, vol. 7, pp. 1225–1227 (Nov., 1995).

Blum, et al., "Electrical and Optical Characteristics of AlAsSb/GaAsSb Distributed Bragg Reflectors for Surface Emitting Lasers," Applied Physics Letters, vol. 67, pp. 3233–3235 (Nov. 1995).

Ochiai, et al., "Kinetics of Thermal Oxidation of AlAs in Water Vapor," Applied Physics Letters, vol. 68, pp. 1898–1900 (1996).

Chang–Hasnain, et al., "Low Threshold Buried Heterostructure Vertical Cavity Surface Emitting Laser," Applied Physics Letters, vol. 63, pp. 1307–1309 (Sep. 1993).

MacDougal et al., "Electrically–Pumped Vertical Cavity Lasers with $Al_xO_y$–GaAs Reflectors," *IEEE Photonics Technology Letters*, vol. 8, No. 3, pp. 310–312 (Mar. 1996).

Primary Examiner—Savitri Mulpuri
Attorney, Agent, or Firm—Jagtiani & Associates

[57] ABSTRACT

A method for fabricating an improved aperture is provided in which an oxidizable layer is deposited on a substrate, a mask is deposited in a first region over the oxidizable layer to leave a second region exposed, the oxidizable layer in the second region is removed, additional non-oxidizable material is deposited over the second region, a side wall of the oxidizable region is exposed, and the oxidizable layers is oxidized to form an oxidized region in at least a portion of the first region.

8 Claims, 4 Drawing Sheets

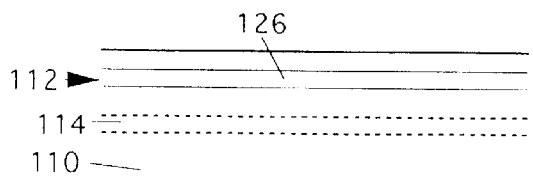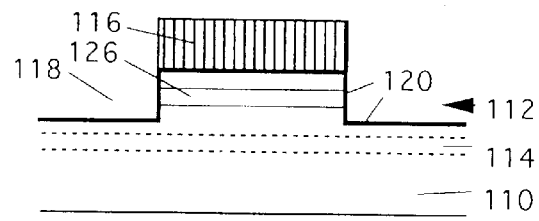
Figure 7a
Figure 7b
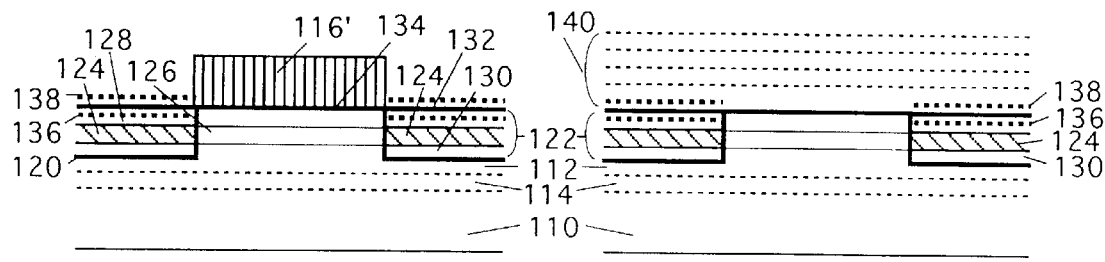
Figure 7c
Figure 7d
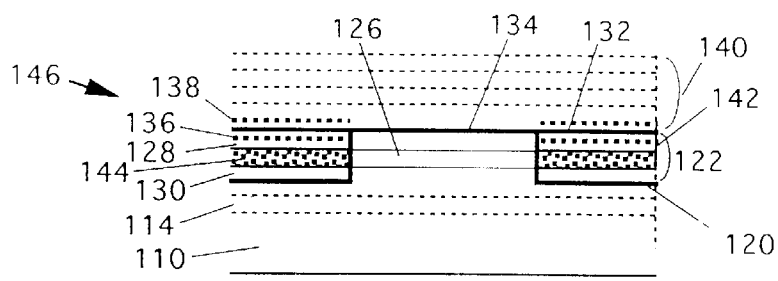
Figure 7e
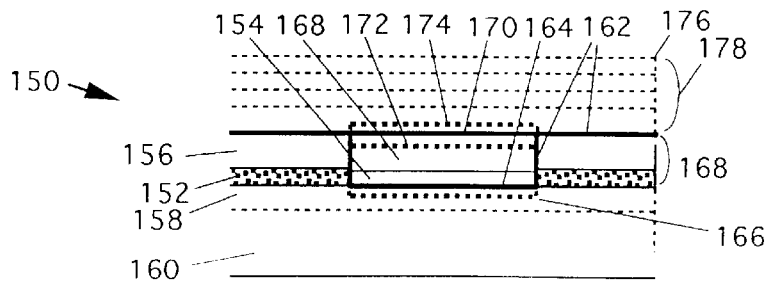
Figure 8

5,985,683

METHOD FOR PRODUCING AN APERTURE COMPRISING AN OXIDIZED REGION AND A SEMICONDUCTOR MATERIAL

This application is a Division of application Ser. No. 08/699,697, filed Aug. 19, 1996, U.S. Pat. No. 5,724,374.

This invention is made with government support under contract number F49620-97-C-0068, awarded by the United States Department of Defense. The government may have certain rights in this invention.

CROSS-REFERENCE TO RELATED APPLICATIONS

This application makes reference to the following co-pending U.S. Patent Applications. The first application is U.S. App. No. 08/547,165, entitled "Conductive Element with Lateral Oxidation Barrier," filed Dec. 18, 1995. The second application is U.S. App. No. 08/659,942, entitled "Light Emitting Device Having an Electrical Contact Through a Layer containing Oxidized Material," filed Jun. 7, 1996. The third application is U.S. App. No. 08/686,489 entitled "Lens Comprising at Least One Oxidized Layer and Method for Forming Same," filed Jul. 25, 1996. These applications are hereby incorporated by reference.

BACKGROUND OF THE INVENTION

1. Field of the Invention

The present invention relates generally to light emitting devices, and more particularly to an improved vertical cavity light emitting device having an improved intra-cavity aperture structure formed by selective oxidation in which the extent of the selective oxidation is controlled by etching a semiconductor from a first region and overgrowing a different material in that first region.

2. Description of the Prior Art

Vertical-Cavity Surface-Emitting Lasers (VCSELs), Surface Emitting Lasers (SELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

VCSELs or Surface Emitting Lasers SELs whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 425° C. temperature with high water-vapor content. VCSELs or any other vertical light emitting devices employing laterally oxidized layers have been strictly limited only to structures which have been grown upon gallium arsenide (GaAs) substrates. For further details, see U.S. Pat. No. 5,493,577, by Choquette et al.

Another advantageous feature is to have one or both mirrors in which some of the layers are laterally oxidized layers. Such mirrors achieve very high reflectivities with a relatively small number of layers compared to all-semiconductor mirrors. For example, a 99.95% reflecting bottom mirror may be grown with 5 to 7 periods instead of the more usual 25 to 30 periods. Such mirrors have desirable features over the all-semiconductor mirrors, especially for longer wavelengths, such as wavelengths greater than 1.2 $\mu$m.

Since VCSELs are presently the subject of intense research and development, a great deal of results and advancements are published monthly. The following is a summary of the prior art documents which are relevant to the problem of utilizing oxide apertures or regions.

Most reports of the oxidation process describe oxidation in layers of aluminum arsenide (AlAs) or aluminum gallium arsenide ($Al_xGa_{1-x}As$) where the Al concentration, x, is close to unity. As reported by Choquette, et al. in "Low threshold Voltage Vertical-Cavity Lasers Fabricated by Selective Oxidation," which appeared in Electronics Letters, volume 24, pp. 2043-2044, 1994, reducing the Al concentration from x=1.0 to x=0.96 reduces the oxidation rate by more than one order of magnitude. At x=0.87, the oxidation rate is reduced by two orders of magnitude compared to x=1.0. Due to the extreme sensitivity of the oxidation rate to the Al concentration and the fact that Al concentration may vary from wafer to wafer or even over the area of a single wafer, the manufacturability of oxidized VCSELs has been questioned. In the publication by Choquette et al., entitled "Fabrication and Performance of Selectively Oxidized Vertical-Cavity Lasers," which appeared in IEEE Photonics Technology Letters, vol. 7, pp. 1237–1239, (November, 1995), this problem was noted followed by the observation that "Therefore, stringent compositional control may be necessary for wafer scale manufacture of uniformly sized oxide apertures."

A limited form of lateral control of oxidation is reported in the publication by Dallesasse, et al. entitled "Hydrolyzation Oxidation of $Al_xGa_{1-x}As$-AlAs-GaAs Quantum Well Heterostructures and Superlattices," which appeared in Applied Physics Letters, volume 57, pp. 2844–2846, 1990. The same work is also described in U.S. Pat. Nos. 5,262,360 and 5,373,522, both by Holonyak and Dallesasse. In that work, GaAs-AlAs superlattices were interdiffused in selected regions by impurity-induced layer disordering (IILD). The interdiffusion was essentially complete in the selected regions, thus the interdiffused regions comprised an AlGaAs compound having an Al concentration being approximately uniform and equal to the average Al concentration of the original constituent AlAs and GaAs layers. The oxidation proceeded through the superlattice regions but not significantly into the interdiffused regions. The superlattice was not doped and contained no other structure from which to fabricate any electronic or optoelectronic device. No attempt was made to form any kind of conductive aperture or boundary.

Formation of VCSELs which emit a wavelengths longer than about 1.1 $\mu$m has been difficult in the prior art. Despite numerous efforts toward developing 1.3–1.55 $\mu$m emitting VCSELs, only recently as room-temperature continuous-wave emission been reported as in the publication by Babic et al. entitled "Room-Temperature Continuous-Wave Operation of 1.54 $\mu$m Vertical-Cavity Lasers," which appeared in IEEE Photonics Technology Letters, vol. 7, pp. 1225–1227 (November, 1995). In that work, fabrication was accomplished by fusing semiconductor mirrors and active regions epitaxially grown on three separate substrates. Another approach to forming 1.3–1.55 $\mu$m emitting VCSELs is to grow semiconductor mirrors of aluminum arsenide antimonide (AlAsSb) and aluminum gallium arsenide antimonide (AlGaAsSb) on indium phosphide (InP) substrates as reported by Blum et al., in the publication entitled "Electrical and Optical Characteristics of AlAsSb/GaAsSb Distributed Bragg Reflectors for Surface Emitting Lasers," which appeared in Applied Physics Letters, vol. 67, pp. 3233–3235 (November 1995).

The oxidation rate of materials such as AlGaAs is a sensitive function of the Al concentration as described by Choquette et al. in Electronics Letters 30, pp. 2043–2044 (1994). It is therefore possible to control the extent of oxidation for multiple layers in a single process by having the layers be of different material compositions. It has also been found however, that the precise composition of a pre-oxidized layer may have a profound effect on the reliability of the oxidized structure. For example, oxidized $Al_{0.98}Ga_{0.02}As$ layers appear to be much more reliable than oxidized AlAs layers. Thus, it is preferred that all oxidizable layers in the structure have nominally the same material composition.

A thorough discussion on how the oxidation rate varies with temperature is described by Ochiai et al. in Applied Physics Letters, vol. 68, pp. 1898–1900 (1996). The authors show that for low oxidation temperatures and small oxidation depths, the oxidation depth varies linearly with time. For higher oxidation temperatures and/or large oxidation depths, the depth varies as the square root of time.

SUMMARY OF THE INVENTION

It is therefore an object of the invention to provide an improved oxide-formed aperture which is manufacturable.

It is another object of the invention to provide an improved oxide-formed aperture which is reliable.

It is another object of the invention to provide an improved oxide-formed aperture which comprises multiple layers.

It is another object of the invention to provide an improved oxide-formed aperture in which the extent of the oxidation is controlled and defined by photolithography.

It is another object of the invention to provide a light emitting diode which utilizes the oxide-formed aperture.

It is another object of the invention to provide a vertical-cavity surface-emitting laser which utilizes the oxide-formed aperture.

According to one broad aspect of the present invention, there is provided an aperture comprising: at least a first layer; the first layer being oxidized in a laterally oriented first region; the first layer being modified within a laterally oriented second region, the second region being oxidized less than the first region; a second layer disposed in communication with the first layer, the second layer being oxidized less than the first layer; and a non-planar boundary having top and bottom boundary surfaces and side walls connecting the top and bottom boundary surfaces, the top boundary surface defined as a top surface of the second layer above the laterally oriented first region and the bottom boundary surface defined as a bottom surface of the laterally oriented second region, the first and second regions defining an aperture.

According to another broad aspect of the invention, there is provided an aperture comprising: at least a first layer having a first thickness; the first layer being oxidized in a laterally oriented first region; the first layer being modified within a laterally oriented second region, the second region being oxidized less than the first region; and a non-planar boundary having top and bottom boundary surfaces and side walls connecting the top and bottom boundary surfaces, the bottom boundary surface defined as a bottom surface of the first region, the top boundary surface defined as above the second region and having a height above the bottom surface equal to or greater than the first thickness, the first and second regions defining an aperture.

According to another broad aspect of the invention, there is provided an aperture comprising: at least a first non-oxidized region having a non-oxidized mesa, a height of the mesa defining a first thickness; and a second laterally oriented region disposed on either side of the mesa, the second region having a second thickness, the second region comprising a laterally oriented oxidized region disposed therein.

According to another broad aspect of the invention, there is provided a planar aperture comprising: a first region surrounding a second region; the first region comprising a first material comprising aluminum oxide, the first material characterized by a first aluminum concentration; the second region comprising a second material which is a non-oxidized semiconductor, the second material characterized by a second aluminum concentration less than the first concentration.

According to another broad aspect of the invention, there is provided a planar aperture comprising: a first region surrounding a second region; the first region comprising a first material comprising aluminum oxide, the first material characterized by a first aluminum concentration; the second region comprising a second material which includes a concentration of at least 5% of at least one element selected from the group consisting of: phosphorus, nitrogen, and antimony.

According to another broad aspect of the invention, there is provided a method for fabricating an aperture comprising the steps of: depositing an oxidizable layer onto a substrate; depositing a mask in a first region over the oxidizable layer, leaving a second region exposed; removing the oxidizable layer in the second region; depositing additional material over the second region, the additional material comprising a non-oxidizable material having a rate of oxidation slower than a rate of oxidation for the oxidizable material by a factor of at least 1.5; exposing a side wall of the oxidizable layer; and oxidizing the oxidizable layer to form an oxidized region in the first region.

According to another broad aspect of the invention, there is provided a method for fabricating an aperture comprising the steps of: depositing an oxidizable layer onto a substrate; depositing a mask in a first region over the oxidizable layer, leaving a second region exposed; removing the oxidizable layer in the second region; oxidizing the oxidizable layer to form an oxidized region outside of the second region; and depositing additional material over the second region.

According to another broad aspect of the invention, there is provided a method for fabricating an aperture comprising the steps of: depositing a mask over a first region of a substrate, leaving a second region exposed; removing material from the second region; depositing additional material over the first and second regions, the additional material comprising an oxidizable material to form a first oxidizable region in the first region and a second oxidizable region in the second region; exposing a side wall of the first oxidizable region; and oxidizing the first oxidizable region to form an oxidized region.

According to another broad aspect of the invention, there is provided a method for fabricating an aperture comprising the steps of: depositing a mask over a first region of a substrate, leaving a second region exposed; removing material from the second region; depositing additional material over the second region, the additional material comprising an oxidizable material to form an oxidizable region in the second region; exposing a side wall of the oxidizable region; and oxidizing the oxidizable region to form an oxidized region.

According to another broad aspect of the invention, there is provided a method for fabricating an aperture comprising the steps of: depositing an oxidizable layer onto a substrate; depositing a mask over a first region of the oxidizable layer, leaving a second region exposed; removing material from the second region; depositing additional material over the second region, the additional material comprising a non-oxidizable material having a rate of oxidation slower than a rate of oxidation for the oxidizable material by a factor of at least 1.5; exposing a side wall of the oxidizable layer; and oxidizing the oxidizable layer to form an oxidized region.

Other objects and features of the present invention will be apparent from the following detailed description of the preferred embodiment.

BRIEF DESCRIPTION OF THE DRAWINGS

The invention will be described in conjunction with the accompanying drawings, in which:

FIGS. 7a, 7b, 7c, 7d and 7e are cross sections illustrating the primary steps for fabrication of an oxide-formed aperture in which the outlying portion of a region is removed and replaced by oxidizable and non-oxidizable materials, which is constructed in accordance with an alternate embodiment of the invention;

FIG. 8 is a cross section of an oxide-formed aperture in which the central portion of an oxidizable layer is removed and replaced by a non-oxidizable material, which is constructed in accordance with an alternate embodiment of the invention;

DETAILED DESCRIPTION OF THE PREFERRED EMBODIMENT

Figure 1:
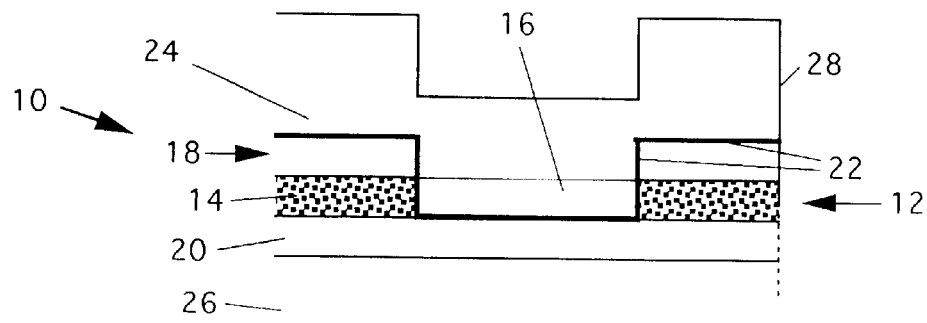
FIG. 1 is a cross section of an oxide-formed aperture in which the central portion of an oxidizable layer is removed and replaced by a non-oxidizable material, which is constructed in accordance with a preferred embodiment of the invention.

With reference to the Figures, wherein like reference characters indicate like elements throughout the several views and, in particular, with reference to FIG. 1, a cross section of a lens or aperture 10 is illustrated which has an initially oxidizable layer or first layer 12 and non-oxidized layers 18,20. The various layers are preferably semiconductor layers comprising group-III and group-V elements, for example: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP or InAlGaAsSb, or any combination thereof for the initially oxidizable layer 12, and GaAs, AlGaAs, InAlGaAs, InAlGaP, GaAsSb, GaPSb, AlGaPSb, InGaAs, or InGaAsP, AlPSb, AlGaP, InAlGaAsSb, InGaP, or InPor any combination thereof for the non-oxidizable layers 18,20.

The term oxidizable and oxidized are used consistently throughout the application and it should be appreciated that at least extensive parts of the initially oxidizable layers are oxidized during fabrication and thus produce oxidized material, regions, portions or layers. By an initially oxidizable material or layer, applicant means any group III-V material with sufficient aluminum (Al) content which may be oxidized significantly under the process for manufacturing lens or aperture 10. For example, the initial Al content may be greater than 20% of the group III material. By an oxidized semiconductor material or layer, applicant means any region of an Al bearing III–V material where oxygen has replaced the group V material in a proportion being greater than or equal to 90%.

It should be appreciated that nay material, including material referred to as "non-oxidizable," may be oxidized, given a sufficiently high oxidation temperature and/or long enough time, especially if the oxidation is not extensive. Therefore, applicant mans that layers 18,20 resists oxidation to a great extent. This may be accomplished by the semiconductor material having a sufficient amount of oxidation inhibiting elements such as, but not limited to: Ga, In or P. By a non-oxidized semiconductor material, applicant means any III–V material where the oxygen has replaced the group V material in a proportion being less than or equal to 10%. The terms non-oxidizable and non-oxidized are used consistently throughout the application and it should be appreciated that the non-oxidizable materials are not extensively oxidized during the fabrication conditions and thud produce non-oxidized materials. For example, given a semiconductor material, AlGaAs, with the group III component having about 15% Ga and 85% Al, the resulting non-oxidized material would oxidize about two orders of magnitude more slowly than AlAs. Under appropriate conditions for oxidizing AlAs, such AlGaAs will therefore not oxidize extensively. Thus, the terms "oxidizable" and "non-oxidizable" are relative. For the oxidation processes used in the preferred embodiments, it is preferable to maintain at least two times the oxidation rate between the oxidizable and non-oxidizable semiconductor materials. Finally, it is to be appreciated that limited portions of non-oxidizable material may become oxidized. For example, the outer side walls of the non- oxidizable material may become oxidized.

Turning now to FIG. 1, there is illustrated lens or aperture 10 which comprises an oxidized region 14 which substantially surrounds non-oxidized region 16. Regions 14 and 16 are disposed in initially oxidizable layer or first layer 12. Preferably, oxidized region 14 is bounded above and below by non-oxidized layers 18 and 20, or second and third layers respectively. In this embodiment, before its oxidation to form oxidized region 14, initially oxidizable layer 12 had a central portion or region 72 removed and replaced with a relatively non-oxidizable material to form a non-oxidized region 16. After removal of central region 72 as illustrated in FIG. 5b, non-planar boundary 22 is formed, which initially comprises an exposed surface. This exposed surface of non-planar boundary 22 may subsequently be partially or entirely covered by overgrown material 24. Lens or aperture 10 preferably resides on a substrate 26. During the oxidation process oxidizable layer 12 is accessed by a side wall 28 which extends to a depth at least as low as a top of oxidizable layer 12. It should be appreciated that side wall 28 may remain exposed after the oxidation process. Additionally, it should be appreciated that side wall 28 may remain exposed after the oxidation or sidewall 28 may be covered or otherwise modified. Non-oxidized layer 20 may comprise part of substrate 24, or it may optionally, be deposited layer. It should be appreciated that any number of layers may be disposed between non-oxidized layer 20 and substrate 26.

Preferably, the layers are deposited by an epitaxial growth process such as molecular beam epitaxy, metal-organic vapor phase epitaxy, or other epitaxial processes. A preferred method for oxidizing the oxidized region 14 is to form sidewall 26 by etching, then place lens or aperture 10 in a water vapor environment at a temperature greater than 300° C. The oxidation then proceeds from outer sidewall 28 until the oxidation conditions are removed.

Figure 2:
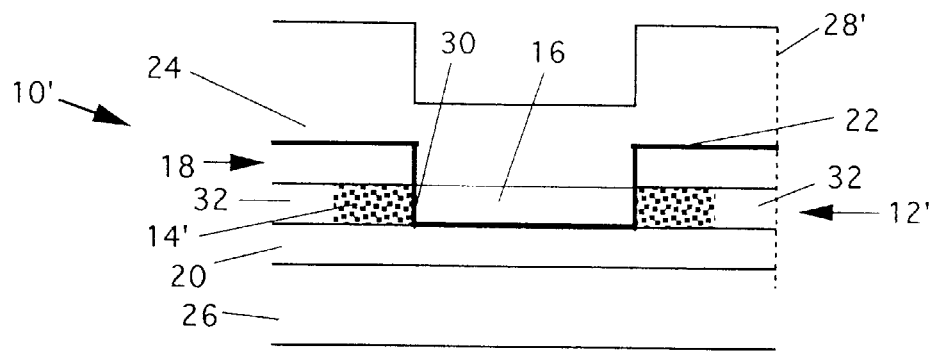
FIG. 2 is a cross section of an oxide-formed aperture in which the central portion of an oxidizable layer is removed and replaced by a non-oxidizable material, which is constructed in accordance with an alternate embodiment of the invention.

Turning now to FIG. 2, an alternate embodiment of the invention is illustrated. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

As may be seen, there is illustrated a lens or aperture 10' which comprises an oxidized region 14' which substantially surrounds a non-oxidized region or second region 16. Regions 14' and 16 are disposed in an initially oxidizable layer 12. Preferably, oxidized region 14' is bounded above and below by non-oxidized regions 18 and 20, respectively. In this embodiment, before its oxidation to form region 14', initially oxidizable layer 12 had a central region 86 removed and replaced with a relatively non-oxidized material to form non-oxidized region 32. After removal of central region 86 as illustrated in FIG. 5b, a non-planar boundary 22 is formed, which initially comprises an exposed surface. Since oxidized region 14' may be accessed for oxidation via side portion 30 of non-planar boundary 22, side wall 28' is optional. Layer 12 differs from layer 12' in that layer 12 is oxidized laterally inwardly to form region 14 and layer 12' is oxidized laterally outwardly to form region 14'. Thus, a non-oxidized region 32 may be provided outward of oxidized region 14'. The exposed surface of non-planar boundary 22 may subsequently be partially or entirely covered by overgrown material 24. Lens or aperture 10 preferably resides on substrate 26. Non-oxidized layer 20 may comprise part of substrate 26, or it may optionally be a deposited layer. It should be appreciated that any number of layers may be disposed between non-oxidized layer 20 and substrate 26.

Figure 3:
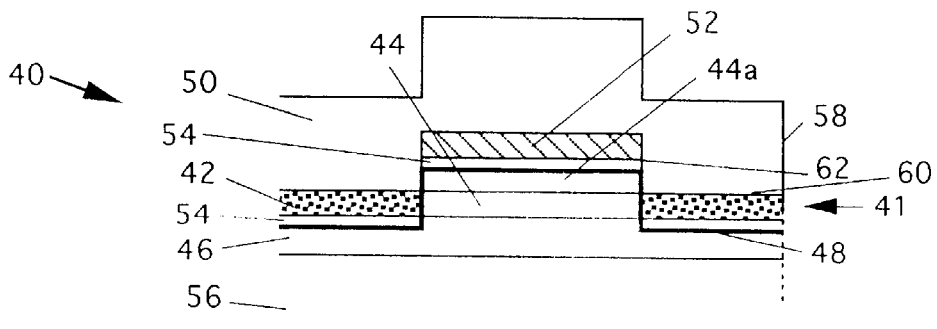
FIG. 3 is a cross section of an oxide-formed aperture in which the outlying portion of a region is removed and replaced by oxidizable and non-oxidizable materials, which is constructed in accordance with an alternate embodiment of the invention.

Turning now to FIG. 3, there is illustrated a lens or aperture 40 which comprises a first layer 41 having an oxidized region 42 which substantially surrounds a non-oxidized region 44 or second region 44. Preferably, oxidized region 42 is bounded below by non-oxidized layer 46. In this embodiment, a top region of lens or aperture 40 comprises a relatively non-oxidizable material to form non-oxidized region 44. After removal of etched outer regions 94 as illustrated in FIG. 6b, non-planar boundary 48 is formed, which initially comprises an exposed surface. This exposed surface of non-planar boundary 48 is subsequently partially or entirely covered by overgrown material 50, which partially comprises oxidizable material 52. Oxidizable material 52 occupies the central region indicated by the reference number 52 and also the outer region referenced as oxidized region 42. Only after the oxidation process is region 42 properly called oxidized region 42. Optionally, underlayer 54 may reside below oxidizable material 52. Aperture 40 preferably resides on substrate 56. During the oxidation process the oxidizable material 52 is accessed by side wall 58 which extends to a depth at least as low as the top 60 of the oxidizable material 52. It should be appreciated that side wall 58 may remain exposed after the oxidation or sidewall 58 may be covered or otherwise modified. Non-oxidized layer 44 may comprise part of substrate 56, or it may optionally be a deposited layer. Preferably, top 60 of oxidized region 42 is at a level below bottom 62 of oxidizable material 52. It should be appreciated that any number of layers may be disposed between non-oxidized layer 46 and substrate 56.

Figure 4:
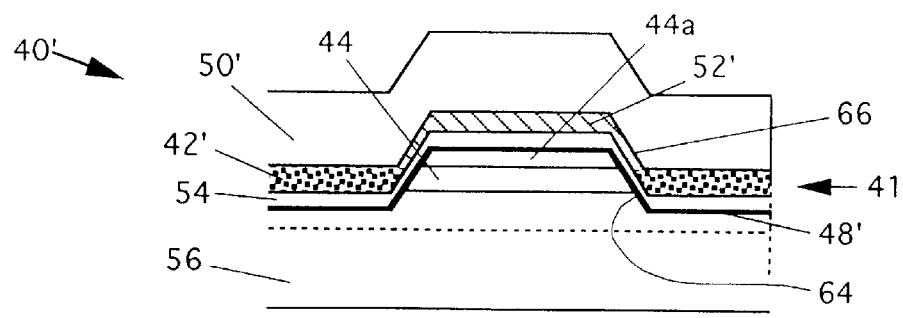
FIG. 4 is a cross section of an oxide-formed aperture in which the outlying portion of a region is removed and replaced by oxidizable and non-oxidizable materials, which is constructed in accordance with an alternate embodiment of the invention.

Turning now to FIG. 4, there is illustrated lens or aperture 40' which is nearly identical to aperture 40. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

The main difference lies in the shape of non-planar boundary 48'. Boundary 48' has sloped, rather than vertical, sidewalls due to the etching process used to form it. The sloped sidewalls 64 give rise to oxidizable material 66 in communication with oxidizable material 52' and oxidized region 42'. Preferably, the thickness of oxidizable material 66 is sufficiently thin as to inhibit the oxidation from proceeding from oxidized region 42' to oxidizable material 66. Preferably, material 66 will have a thickness no greater than 200 Å at its thickest point. For a detailed discussion on the relationship between thickness and oxidation rate, please see co-pending application Ser. No. 08/686,489 which is hereby incorporated by reference.

Figure 5A:
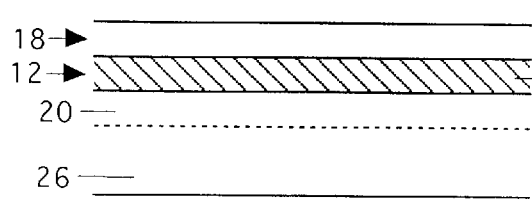
FIGS. 5a, 5b, 5c and 5d are cross sections illustrating the primary steps for fabrication of an oxide-formed aperture in which the central portion of an oxidizable layer is removed and replaced by a non-oxidizable material, which is constructed in accordance with an alternate embodiment of the invention.
Figure 5B:
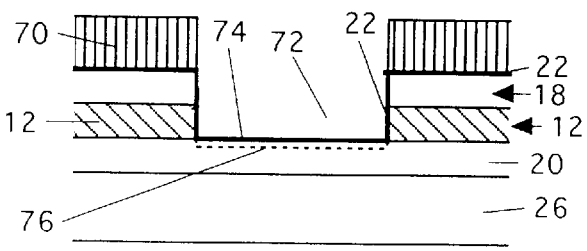

Turning now to FIGS. 5a, 5b, 5c and 5d, there is illustrated a method for fabricating lens or aperture 10 of FIG. 1. Referring first to FIG. 5a, on substrate 26 is grown oxidizable layer 12 and non-oxidizable layer 18. Oxidizable layer 12 and non-oxidizable layer 18 preferably comprise the oxidizable and non-oxidizable materials described previously. Additional layers may be grown below or above layer 12, for example optional layer 20. In FIG. 5b are illustrated mask 70 and etched central region 72. Mask 70 preferably comprises photoresist, polyimide, a dielectric material, a metal, or a combination thereof, and is preferably defined by photolithography. It should be appreciated that any mask 70 known in the etching art may be used in conjunction with the present invention. Etched region 72 is typically circular or square from a top view, but may also be any other shape to enhance or suppress higher-order transverse mode emission in VCSELs. It should be appreciated that these shapes include clover leafs and any non-symmetric shape having a linear, circular, parabolic or elliptical segment as part of the non-symmetric shape.

Figure 5C:
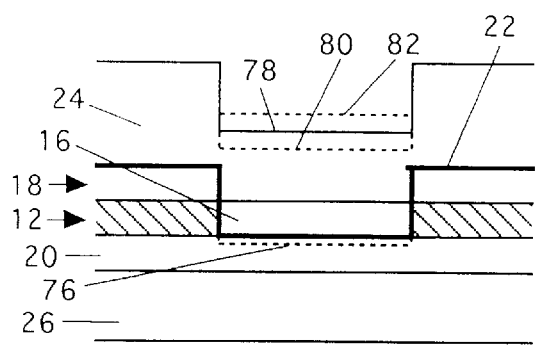

Formation of etched region 72 may be via a wet chemical etch or by dry etching such as plasma etching, ion milling, reactive ion etching, chemically assisted ion beam etching, electron cyclotron etching, or any other material removal process known in the etching art. Nominally, etched region 72 extends just through oxidizable layer 12 to level 74, however it could also extend deeper to level 76. The top of the partially etched structure, not including mask 70, forms non-planar boundary 22. As shown in FIG. 5c material 24 is grown, which partly comprises non-oxidizable region or second region 16. Second region 16 is the region substantially surrounded by layer 12, and it preferably comprises a material from the group of non-oxidizable materials described above. Growth of material 24 is preferably performed by an epitaxial process such as MBE, MOCVD, or variations of these methods, however the growth may also be of non-epitaxial methods such as evaporation, sputtering, chemical vapor deposition, or by other means. Depending on the specific conditions of the overgrowth process, material 24 may have equal thicknesses over all portions of the structure, i.e., to level 78. Or it may be thinner over region 96, i.e., grown to level 80 over region 16, or it may be thicker, i.e., grown to level 82 over region 16. For clarity, region 44a is provided to illustrate the possible height extension of region 44. It should be appreciated that this height extension is not required for operation of lens or aperture 10.

Figure 5D:
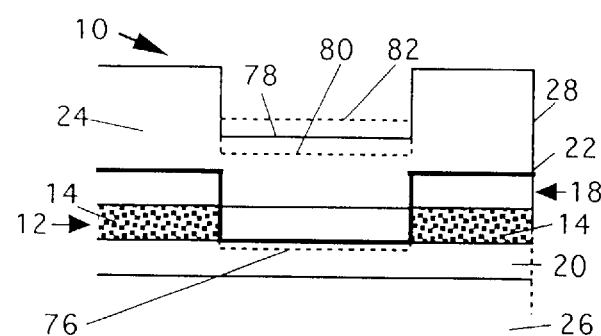

FIG. 5d illustrates the steps of etching side wall 28 and oxidizing the remaining portion of oxidizable layer 12 to form oxidized region 14. The result is lens or aperture 10 as illustrated in FIG. 1.

To form aperture 10' illustrated in FIG. 2, the method proceeds as in FIGS. 5a and 5b. Then the oxidation process is performed, the oxidation initiating from portion 30 of FIG. 2. Finally, material 24 of FIG. 2 is grown over boundary 22. Since the oxidation process is performed prior to the overgrowth, material 24 may be oxidizable or it may be non-oxidizable, even in region 16.

Figure 6A:
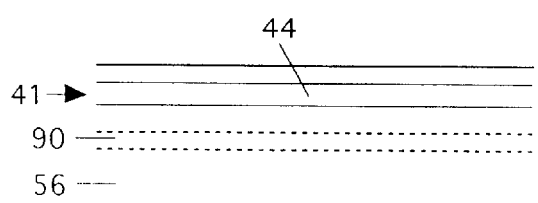
FIGS. 6a, 6b, 6c and 6d are cross sections illustrating the primary steps for fabrication of an oxide-formed aperture in which the outlying portion of a region is removed and replaced by oxidizable and non-oxidizable materials, which is constructed in accordance with an alternate embodiment of the invention.
Figure 6B:
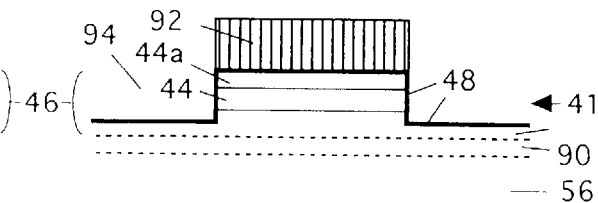

Turning now to FIGS. 6a, 6b, 6c and 6d, there is illustrated a method for fabricating aperture 40 of FIG. 3. Referring first to FIG. 6a, on substrate 56 are grown non-oxidizable region 44 layer 46 and possibly optional layer or layers 90. Non-oxidizable region 44 and layer 46 preferably comprises a material from the group of non-oxidizable material listed above. Additional layers may be grown below or above layer 56, for example layer 90. In FIG. 6b are illustrated mask 92 and etched region 94. Mask 92 preferably comprises photoresist, polyimide, a dielectric material, a metal, or a combination thereof, and is preferably defined by photolithography. It should be appreciated that any mask 92 known in the etching art may be used in conjunction with the present invention. Etched region 94 is typically is typically circular or square from a top view, but may also be any other shape to enhance or suppress higher-order transverse mode emission in VCSELs. It should be appreciated that these shapes include clover leafs and any non-symmetric shape having a linear, circular, parabolic or elliptical segment as part of the non-symmetric shape.

Figure 6C:
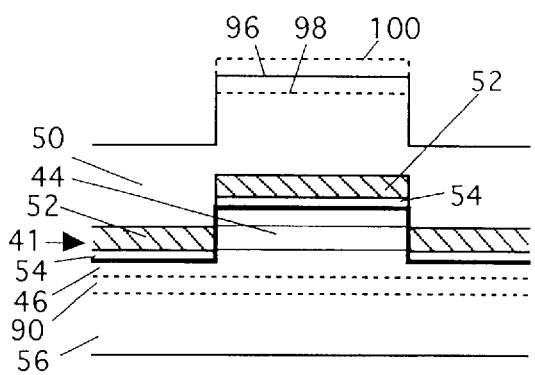

Formation of etched region 94 may be via a wet chemical etch or by dry etching such as plasma etching, ion milling, reactive ion etching, chemically assisted ion beam etching, electron cyclotron etching, or any other material removal process. The top of the partially etched structure, not counting mask 92, forms non-planar boundary 48. Shown in FIG. 6c is overgrown material 50, which partly comprises oxidizable regions 52. Region 44 is the region substantially surrounded by the outer (lower) portion of oxidizable regions 52, and it preferably comprises a material from the group of non-oxidizable materials described above. Growth of material 50 is preferably performed by an epitaxial process such as MBE, MOCVD, or variations of these methods, however the growth may also be of non-epitaxial methods such as evaporation, sputtering, chemical vapor deposition, or by other means. Depending on the specific conditions of the overgrowth process, material 50 may have equal thicknesses over all portions of the structure, i.e., to level 96. Or it may be thinner over region 44, i.e., grown to level 98 over region 44, or it may be thicker, i.e., grown to level 100 over region 44. Additional layers such as optional underlayer 54 may also be grown into the structure.

Figure 6D:
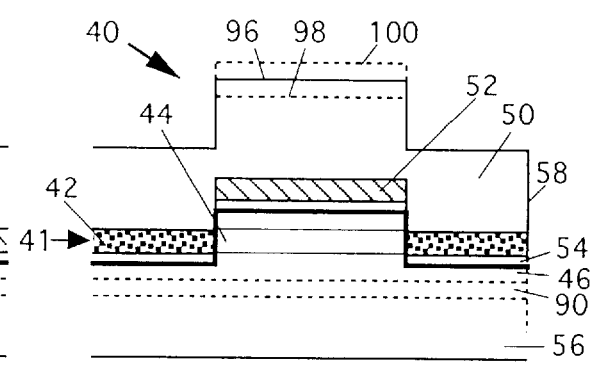

FIG. 6d illustrates the steps of etching side wall 58 and oxidizing the outer (lower) portion of oxidizable layer 52 to form oxidized region 42. The result is lens or aperture 40 as illustrated in FIG. 3.

To form lens or aperture 40' illustrated in FIG. 4, the method proceeds as in FIGS. 6a, 6b, 6c and 6d. As is know in the art sidewall 64 are commonly produced in etching processes and may be formed, for example, by appropriate chemical in a wet etch process, or by appropriate pressure and or chemistry in a dry etch process. Slight differences in the processing parameters may be used to optimize the fabrication process.

Turning now to FIGS. 7a, 7b, 7c, 7d, and 7e, there is illustrated a method for fabricating yet another aperture structure. Referring first to FIG. 7a, on substrate 110 are grown material 112 which includes non-oxidizable region 126 and possibly optional layers 114. Non-oxidizable region 126 preferably comprises a material from the group of non-oxidizable material described above. Additional layers may be grown below or above layer 112, for example layer 114.

In FIG. 7b are illustrated mask 116 and etched region 118. Mask 116 preferably comprises photoresist, polyimide, a dielectric material, a metal, or a combination thereof, and is preferably defined by photolithography. It should be appreciated that any mask 92 known in the etching art may be used in conjunction with the present invention. Etched region 146 is typically circular or square from a top view, but may also be any other shape to enhance or suppress higher-order transverse mode emission in VCSELs. It should be appreciated that these shapes include clover leafs and any non-symmetric shape having a linear, circular, parabolic or elliptical segment as part of the non-symmetric shape.

Formation of etched region 118 may be via a wet chemical etch or by dry etching such as plasma etching, ion milling, reactive ion etching, chemically assisted ion beam etching, electron cyclotron etching, or any other material removal process known in the etching art. The top of the partially etched structure, not including mask 116, forms non-planar boundary 120. Shown in FIG. 7c is selectively overgrown material 122, which partly comprises oxidizable region 124. Mask 116' prevents effective growth of material 122 in regions covered by mask 116'. Preferably, mask 116' is the same mask 116 illustrated in FIG. 7b. A non-oxidizable region 126 is substantially surrounded by oxidizable regions 124, and region 126 preferably comprises a material from the group of non-oxidizable materials described above. Preferably, overgrown material 122 also comprises non-oxidizable material 128 and non-oxidizable material 130. Growth of overgrown material 122 is preferably performed by an epitaxial process such as MBE, MOCVD, or variations of these methods. However, the growth of overgrown material 122 may also be of non-epitaxial methods such as evaporation, sputtering, chemical vapor deposition, or by other means known in the semiconductor growth art. In a preferred method, mask 116' and 116 are the same, comprising silicon nitride, and overgrown material 122 is deposited by MOCVD. Material 122 is grown to boundary 132, preferably to a level equal to that of a top 134 of non-planar boundary 120. Alternatively, it may be grown to level 136 below, or to level 138 above, the level of top 134.

FIG. 7d illustrates the optional additional overgrowth of material 140 over boundary 132 and mesa 134. Material 140 may comprise, for example, DBR mirror layers or conductive material for current injection through non-oxidizable region 126. Material 140 may be deposited by any of the methods described for deposition of material 122. FIG. 7e illustrates the steps of etching side wall 142 and oxidizing oxidizable region 124 to form oxidized region 144. The result is lens or aperture 146.

As may be seen from above, lens or aperture 146 comprises a substrate 110, optional layers 114 disposed above substrate 110, a non-oxidized layer 112 disposed above substrate 110, an optional underlay 130 formed from non-oxidizable material, an oxidized region 144 which substantially surrounds a non-oxidized region 126, and finally overgrowth material 140 which may comprise, for example, DBR mirror layers or conductive material for current injection through non-oxidizable region 126.

Turning now to FIG. 8, there is illustrated a lens or aperture 150 comprising an oxidized region 152 which substantially surrounds a non-oxidized region 154. Preferably, oxidized region 152 is bounded above and below by non-oxidized regions or layers 156 and 158, respectively. Layer 158 may be part of a substrate 160, or layer 158 may be a material deposited on substrate 160. In this embodiment, before oxidation, the initially oxidizable layer, corresponding to region 152, had a central portion removed and replaced with a relatively non-oxidizable material to form non-oxidized region 154. After removal of the central region, non-planar boundary 162 is formed, which initially comprises an exposed surface. Non-planar boundary 162 has a bottom region 164 which is illustrated to have its level coincide with the bottom level of oxidized region 152. Alternatively, bottom region 164 may be at level 166, below the bottom level of oxidized region 152. Overgrown material 168 is selectively deposited over bottom region 164 and includes non-oxidized region 154, which preferably comprises a non-oxidizable material selected from those listed above. Overgrown material 168 may is deposited up to level 170 which is illustrated to coincide with the upper level of non-planar boundary 162. Alternatively, overgrown material 168 may be deposited up to level 172 or level 174, below or above the upper level of non-planar boundary 162. For the oxidation process, initially oxidizable region 152 is accessed by a side wall 176 which extends to a depth at least as low as the top of the initially oxidizable region 152. Additionally, it should be appreciated that side wall 176, or it may remain exposed after the oxidation or sidewall 176 may be covered or otherwise modified. Optionally, additional material 178 may be deposited onto bottom region 164 and overgrown material 168. Material 178 may comprise, for example, DBR mirror layers or conductive material for current injection through non-oxidized region 154. The methods for fabricating lens or aperture 150 are consistent with the methods for fabricating lens or aperture 146.

Figure 9:
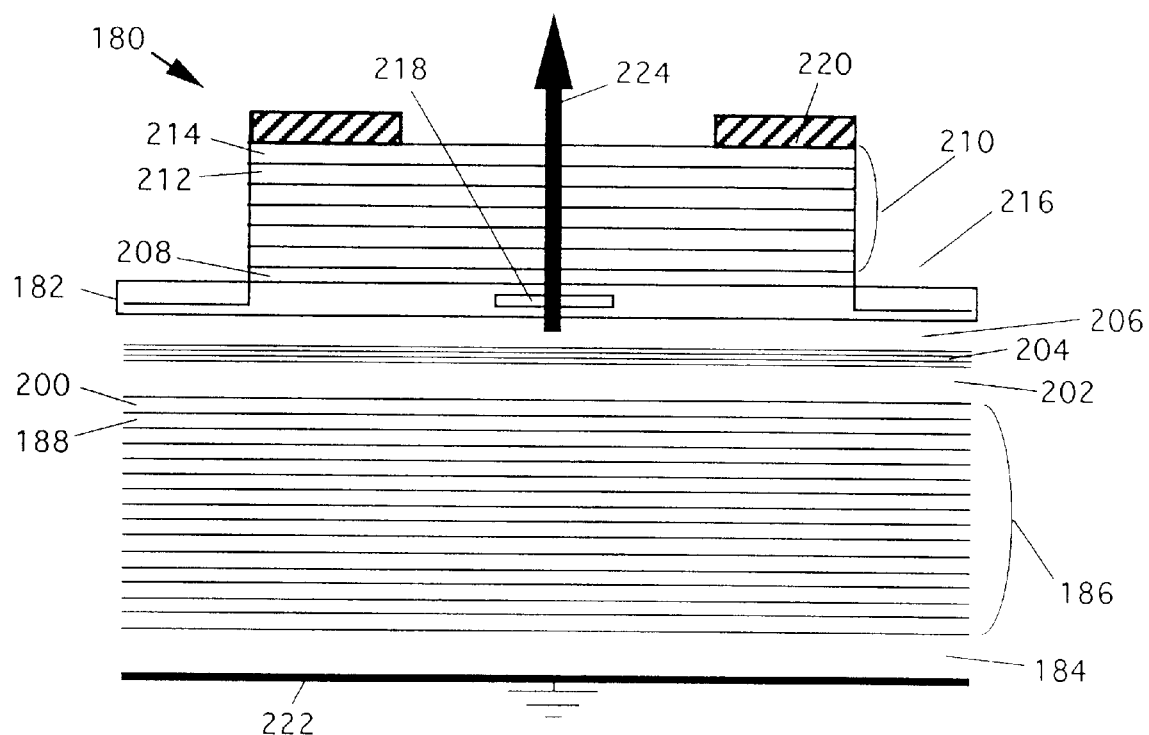
FIG. 9 is a cross section a VCSEL utilizing an aperture from any of the embodiments illustrated above.

Turning now to FIG. 9, there is shown light emitting device 180 which comprises lens and/or aperture 182. In a preferred embodiment, aperture 182 serves the dual function of electrical current aperture and optical intracavity lens. Light emitting device 180 is preferably a vertical cavity surface emitting laser (VCSEL), but it may also be a resonant-cavity light emitting diode (RCLED) or a laser diode. Device 180 may be grown on substrate 184. Bottom mirror 186 comprises high-index layers 188 and low-index layers 200. On bottom mirror 186 is grown bottom spacer 202, active region 204, top spacer 206, and the semiconductor structure comprising at least one oxidizable layer which will form lens and/or aperture 182. Lens and/or aperture 182 may be any of the aperture structures described above, e.g., as illustrated in FIGS. 1, 2, 3, 4, 7e, or 8. Lens and/or aperture 182 may utilize any combination of the described structures and methods. On top of lens and/or aperture 182 may be an optional spacer 208 and top mirror 210 comprising low-index layers 212 and high-index layers 214. If substrate 184 comprises GaAs, bottom mirror 186 may preferably comprise alternating semiconductor layers such as GaAs or AlGaAs for layers 188 and AlAs or AlGaAs for layers 200. If substrate 184 comprises InP, bottom mirror 186 may preferably comprise alternating semiconductor and oxidized layers, such as InGaAs or InP for layers 188 and an oxide for layers 200. Top mirror 210 may comprise similar materials as bottom mirror 186, or may alternatively comprise dielectric materials. To perform the oxidation process to form lens and/or aperture 182, region 216 is formed, for example by etching. After the oxidation process, lens and/or aperture 182 has non-oxidized region 218. Since the oxidized regions of lens and/or aperture 182 have electrical resistivity typically much higher than 10 times as high as non-oxidized region 218, non-oxidized region 218 may form an electrical current aperture. Contacts 220 and 222 are deposited and preferably annealed. The exact positions of contacts 220 and 222 are determined partly by choice. When an electrical current is passed between contacts 220 and 222, the majority of the current passes through the current aperture formed by non-oxidized region 218 in lens and/or aperture 182. The current creates electrons and holes in active region 204 which recombine to emit light. Light which emits substantially perpendicular to the surfaces of mirrors 186 and 210 may be amplified to form light beam 224 emitting at an emission wavelength. When device 180 is a VCSEL and the current is above the VCSEL's current threshold, beam 224 is a laser beam. In mirror 186 or mirror 210, one period of the high- and low-index layers is nominally one half of the emission wavelength divided by the average index of the high- and low-index layers, weighted by their thicknesses.

Figure 10:
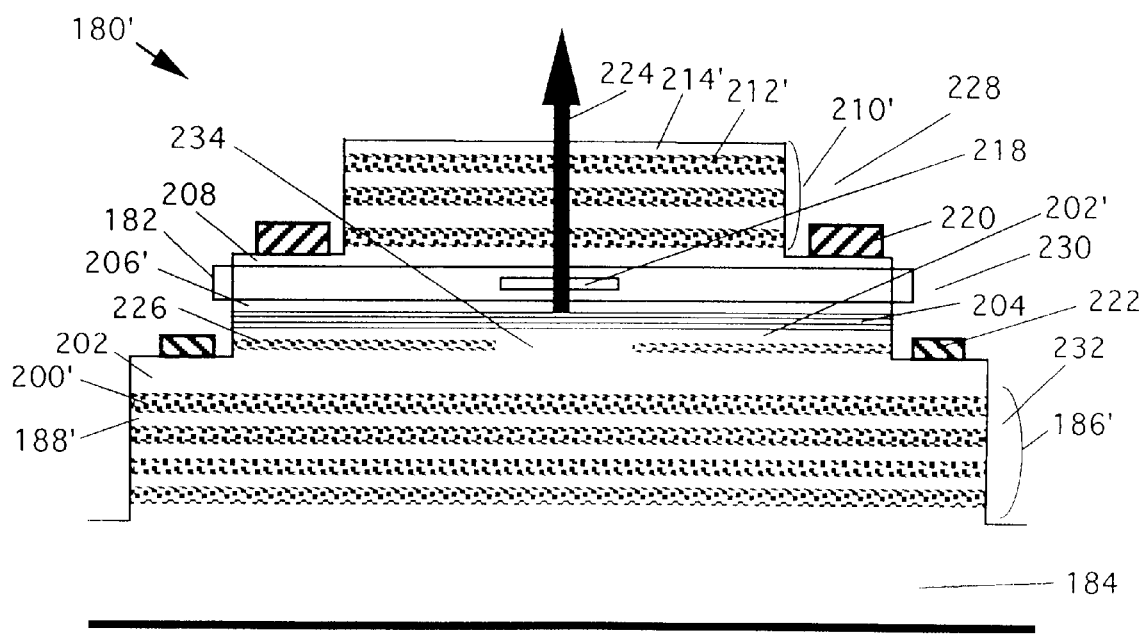
FIG. 10, is a cross section of a VCSEL having oxidized or dielectric mirrors and utilizing an aperture from any of the embodiments illustrated above.

Turning now to FIG. 10, there is shown light emitting device 180' which comprises lens or aperture 182. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

Device 180' is preferably a VCSEL, but it could also be a RCLED or laser diode. Bottom mirror 186' comprises high-index layers 188' and low-index layers 200'. Low index layers 200' may comprise for example oxidized material or relatively-low-index semiconductor material. High index layers 188 may comprise for high-index semiconductor material.

As may be seen an optional aperture 226 is disposed below active region 204 and in spacer 202'. Aperture 226 may be any of the aperture structures described above, e.g., as illustrated in FIGS. 1, 2, 3, 4, 7e, or 8, or utilize any combination of the described structures and methods so long as it has a non-oxidized region 234. Mirror 210', comprising low index layers 212' and high index layers 214'. Low index layers 212' may comprise for example oxidized material, low-index dielectric material or relatively-low-index semiconductor material. High index layers 214' may comprise for example relatively-high-index dielectric material or high-index semiconductor material. Etched side walls 228, 230 and 232 are provided to allow for oxidization of layers 212', 182, and 200', respectively.

It should be appreciated that FIGS. 9 and 10 merely illustrate known configurations of VCSELs where the inventive lens or aperture has been placed in the optical cavity of the VCSEL. This invention contemplates the use of the inventive apertures in any VCSEL structure so long as an optical cavity is present. For examples of other VCSEL designs, see U.S. patent applications: 08/574,165; 08/659,942; and 08/684,489 which are hereby incorporated by reference.

Throughout the application, lens 10 has been referred to as a lens and/or an aperture. It should be appreciated that applicant's lens 10 will function as an aperture but not all apertures will function as a lens in applicant's invention. Additionally, it should be appreciated that non-planar boundaries in FIGS. 1, 2, 3, 7e and 8 may have a tapered shape as that in FIG. 4. Blocks may be employed to stop the oxidation process in the oxidized regions of each embodiment. If this is the case, the non-oxidized region disposed between the oxidized regions may also be constructed from an oxidizable material, but are not oxidized because the blocks will prevent oxidization in these regions. Finally, it should be appreciated that in all of the embodiments illustrated in FIGS. 1 through 4, the overgrown material may comprise the same material as the non-oxidized regions.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. A method for fabricating an aperture comprising the steps of:

depositing an oxidizable layer onto a substrate;

depositing a mask in a first region over said oxidizable layer, leaving a second region exposed;

removing said oxidizable layer in said second region and thereby creating a removed region;

depositing additional material in at least said removed region, said additional material comprising a non-oxidizable material having a rate of oxidation slower than a rate of oxidation for said oxidizable material by a factor of at least 1.5;

exposing a side wall of said oxidizable layer; and oxidizing said oxidizable layer to form an oxidized region in at least a portion of said first region.

2. A method for fabricating an electrically conductive aperture comprising the steps of:

depositing an oxidizable layer onto a substrate;

depositing a mask in a first region over said oxidizable layer, leaving a second region exposed;

removing said oxidizable layer in said second region and thereby creating a removed region;

oxidizing said oxidizable layer to form an oxidized region outside of said removed region; and depositing additional material over at least said removed region.

3. A method for fabricating an electrically conductive aperture comprising the steps of:

depositing a mask over a first region of a substrate, leaving a second region exposed;

removing material from said second region and thereby creating a removed region;

depositing additional material over said first and removed regions, said additional material comprising an oxidizable material to form a first oxidizable region in said first region and a second oxidizable region in said removed region;

exposing a side wall of said first oxidizable region; and oxidizing said first oxidizable region to form an oxidized region.

4. The method recited in claim 3, further comprising the step of:

removing said mask after said removing step.

5. A method for fabricating an electrically conductive aperture comprising the steps of:

depositing a mask over a first region of a substrate, leaving a second region exposed;

removing material from said second region and thereby creating a removed region;

depositing additional material at least in said removed region, said additional material comprising an oxidizable material to form an oxidizable region in said removed region;

exposing a side wall of said oxidizable region; and oxidizing said oxidizable region to form an oxidized region.

6. The method recited in claim 5, further comprising the step of:

removing said mask after said second depositing step.

7. A method for fabricating an aperture comprising the steps of:

depositing a first oxidizable layer onto a substrate;

depositing a mask over a first region of said first oxidizable layer, leaving a second region exposed;

removing material from said second region and thereby creating a removed region;

depositing additional material in at least said removed region, said additional material comprising a second oxidizable material having a rate of oxidation slower than a rate of oxidation for said first oxidizable material by a factor of at least 1.5;

exposing a side wall of said oxidizable layer; and oxidizing said second oxidizable layer to form an oxidized region.

8. The method recited in claim 7, further comprising the step of: removing said mask after said depositing additional material step.

* * * * *